(12) United States Patent
Ue et al.

(10) Patent No.: US 7,635,940 B2
(45) Date of Patent: Dec. 22, 2009

(54) ULTRASONIC MOTOR AND MICROSCOPE STAGE

(75) Inventors: Yoshihiro Ue, Hidaka (JP); Yasuaki Kasai, Saitama (JP); Nagahide Sakai, Tokyo (JP); Makoto Harada, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/986,409

(22) Filed: Nov. 21, 2007

(65) Prior Publication Data

US 2008/0122316 A1 May 29, 2008

(30) Foreign Application Priority Data

Nov. 29, 2006 (JP) ............................. 2006-321356

(51) Int. Cl.
*H01L 41/09* (2006.01)
(52) U.S. Cl. .............. 310/317; 310/316.02; 310/323.19
(58) Field of Classification Search ................. 310/323, 310/316.02, 323.19, 317
See application file for complete search history.

(56) References Cited

U.S. PATENT DOCUMENTS

| | | | | |
|---|---|---|---|---|
| 5,936,328 | A * | 8/1999 | Takano et al. | 310/323.02 |
| 6,218,769 | B1 * | 4/2001 | Iino et al. | 310/328 |
| 6,806,620 | B1 | 10/2004 | Wischnewskiy | |
| 7,061,159 | B2 * | 6/2006 | Funakubo | 310/323.12 |
| 2004/0256956 | A1 * | 12/2004 | Miyazawa | 310/328 |
| 2006/0238072 | A1 | 10/2006 | Funakubo | |
| 2007/0052329 | A1 * | 3/2007 | Koc et al. | 310/365 |
| 2008/0030101 | A1 * | 2/2008 | Funakubo | 310/316.02 |

FOREIGN PATENT DOCUMENTS

| | | |
|---|---|---|
| JP | 2722211 B2 | 11/1997 |
| JP | 2004-201380 A | 7/2004 |
| JP | 2005-065358 A | 3/2005 |
| JP | 2005-091866 A | 4/2005 |
| JP | 2005-237102 A | 9/2005 |
| JP | 2005-295656 A | 10/2005 |
| JP | 2006-060899 A | 3/2006 |
| WO | WO 2004/088830 A1 | 10/2004 |

OTHER PUBLICATIONS

Japanese Office Action dated Jan. 6, 2009 (7 pages), and English translation thereof (8 pages), issued in a counterpart Japanese Application No. 2006-321356.
Extended European Search Report dated Sep. 11, 2009 (8 pages), issued in counterpart European Application Serial No. 07022508.1.

* cited by examiner

*Primary Examiner*—Walter Benson
*Assistant Examiner*—Bryan P Gordon
(74) *Attorney, Agent, or Firm*—Frishauf, Holtz, Goodman & Chick, P.C.

(57) ABSTRACT

An ultrasonic motor includes a vibrator formed by stacking a plurality of rectangular piezoelectric plates in a thickness direction, a driving circuit for applying a driving signal to a piezoelectric plate, and a detection circuit for detecting an electromotive force generated when the piezoelectric plate deforms, and this ultrasonic motor is configured in such a manner that there are a first piezoelectric plate and a second piezoelectric plate among the plurality of rectangular piezoelectric plates, the first and the second piezoelectric plate each is a piezoelectric plate in which a longitudinal vibration polarization portion that can excite longitudinal vibrations and a bending vibration polarization portion that can excite bending vibrations are polarized in a thickness direction, and the first piezoelectric plate is connected to the driving circuit and the detection circuit, and the second piezoelectric plate is connected to the driving circuit and is not connected to the detection circuit.

12 Claims, 10 Drawing Sheets

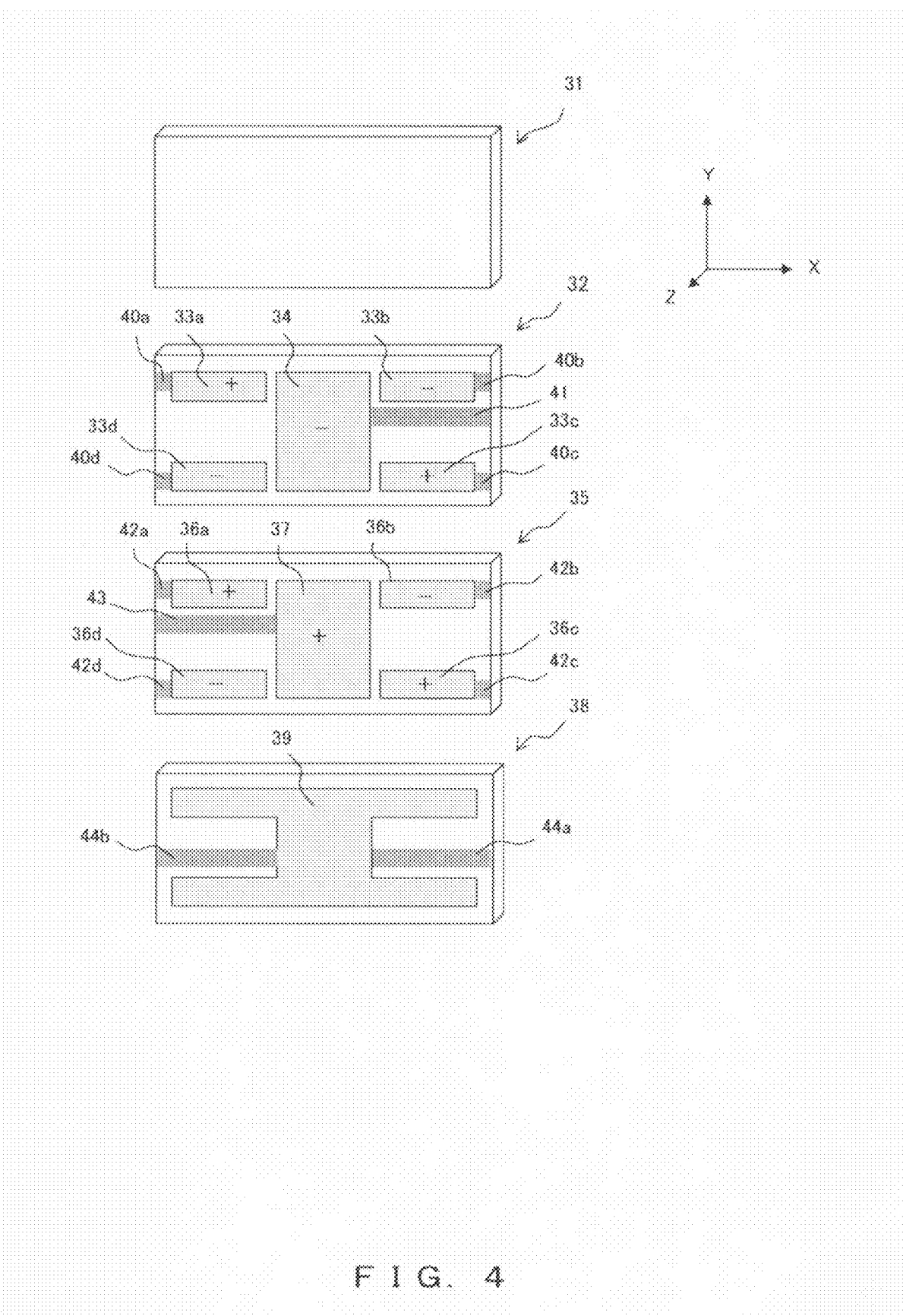
F I G. 4

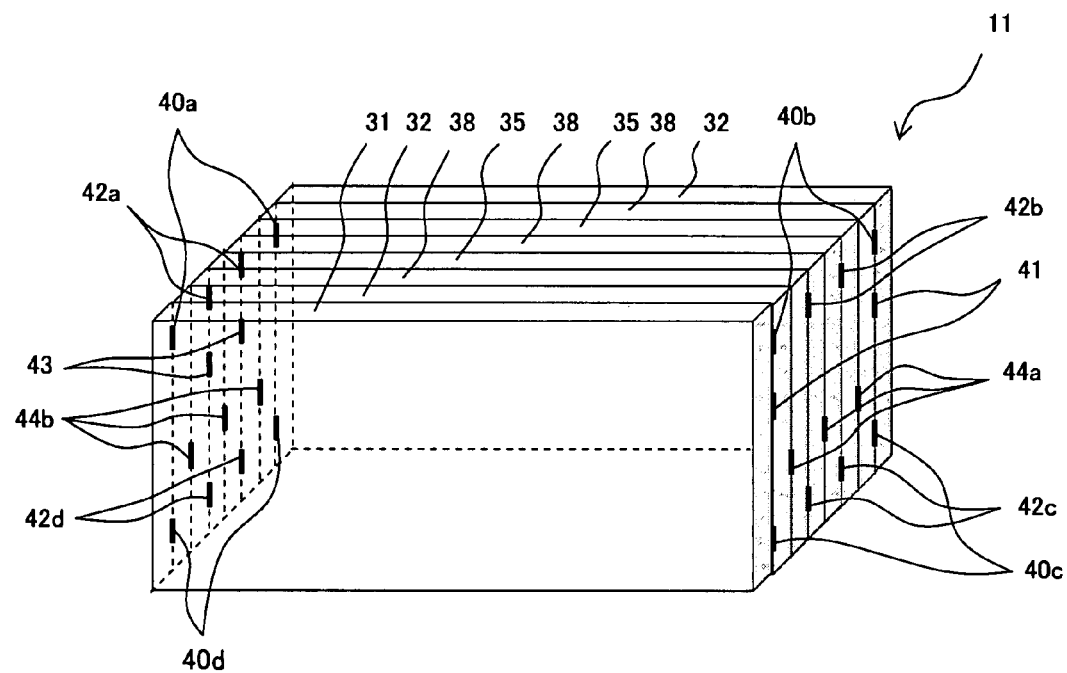
F I G. 5

ULTRASONIC MOTOR AND MICROSCOPE STAGE

CROSS REFERENCE TO RELATED APPLICATIONS

This application is based upon and claims the benefit of priority from the prior Japanese Patent Application No. 2006-321356, filed Nov. 29, 2006, the entire contents of which are incorporated herein by reference.

BACKGROUND OF THE INVENTION

1. Field of the Invention

The present invention relates to an ultrasonic motor for use in such fields as controlling a microscope stage, in which positioning steps are required.

2. Description of the Related Art

In recent years, ultrasonic motors that realize high-speed operations and inching operations over a relatively wide range while being able to be configured to be small in size have gathered interest as actuators for precision instruments. One of the ultrasonic motor types is the ultrasonic motor that is configured as disclosed in Patent Document 1 (Japanese Patent No. 2722211), Patent Document 2 (Japanese Patent Application Publication No. 2004-201380), and Patent Document 3 (Japanese Patent Application Publication No. 2005-295656). The ultrasonic motor disclosed in these documents employs a configuration in which the longitudinal vibrations (also referred to as the stretching vibrations) and the bending vibrations are excited at the same time, and thereby elliptical vibrations are caused at the position at which the ultrasonic motor contacts the driven object in order to move the driven object in desired directions. A piezoelectric body is commonly employed as a material for the ultrasonic motors. By applying alternating currents having different phases to a longitudinal vibration electrode and a bending vibration electrode formed on the piezoelectric body, the elliptical vibrations are caused. Because of the application of the alternating currents having different phases, when the deformation direction of the longitudinal-vibration-electrode portion in the piezoelectric body and that of the bending-vibration-electrode portion in the piezoelectric body overlap each other, one electrode portion in the piezoelectric body may be forced to shorten while the other electrode portion stretches.

Also, the ultrasonic motors are configured to achieve a large vibration amplitude by utilizing their own resonance frequency. Accordingly, when the resonance frequency that was set as the initial setting is changed due to a change in the ambient temperature or in the contacting state between the motor and the driven object, the vibration amplitude becomes smaller and the moving distance of the driven object is affected. In order to cope with this problem, an ultrasonic motor as disclosed in FIG. 4 of Patent Document 4 (Pamphlet of WO 04/088830) is suggested in which a vibration detection electrode is provided for monitoring the vibrating state of the vibrator.

Also, when an ultrasonic motor is to be used in a state in which it is incorporated with a microscope stage or the like, pre-load has to be applied to the vibrator to some extent in order to prevent the movable portions of the stage from being moved easily (for example, a pre-load of about 20 N is required in order to achieve a holding force of about 5 N). This condition requires the ultrasonic motor to be able to output power that is sufficiently high, and also to be rigid, which is achieved by using materials that are thick enough and wide enough to sustain such a pre-load. In order to meet this requirement, a larger current has to flow to the driving electrodes, especially if the total amount of the current flowing to the GND becomes large because the current that has flowed to the respective driving electrodes flows to the GND. In the case of, for example, the vibrator disclosed in Patent Document 5 (Japanese Patent Application Publication No. 2005-65358), there is only one GND electrode while there are four driving electrodes, and there is only one connecting point for the lead wire. Accordingly, in order to prevent the lead wire of the GND from being disconnected due to heat or the like, a lead wire having a larger diameter is required for allowing larger current to flow.

SUMMARY OF THE INVENTION

An ultrasonic motor according to an aspect of the present invention is an ultrasonic motor for causing elliptical vibrations at a contacting point with a driven object by utilizing bending vibrations and longitudinal vibrations, including a vibrator formed by stacking a plurality of rectangular piezoelectric plates in a thickness direction, a driving circuit for applying a driving signal to a piezoelectric plate, and a detection circuit for detecting an electromotive force generated when the piezoelectric plate deforms, in which there are a first piezoelectric plate and a second piezoelectric plate among the plurality of rectangular piezoelectric plates, the first piezoelectric plate and the second piezoelectric plate are each a piezoelectric plate in which a longitudinal vibration polarization portion that can excite the longitudinal vibrations and a bending vibration polarization portion that can excite the bending vibrations are polarized in a thickness direction, and the first piezoelectric plate is connected to the driving circuit and the detection circuit, and the second piezoelectric plate is connected to the driving circuit but is not connected to the detection circuit.

Also, a microscope stage according to another aspect of the present invention is a microscope stage having an ultrasonic motor for causing elliptical vibrations at a contacting point with a driven object by utilizing bending vibrations and longitudinal vibrations, said ultrasonic motor including a vibrator formed by stacking a plurality of rectangular piezoelectric plates in a thickness direction, a driving circuit for applying a driving signal to a piezoelectric plate, and a detection circuit for detecting an electromotive force generated when the piezoelectric plate deforms, in which there are a first piezoelectric plate and a second piezoelectric plate among the plurality of rectangular piezoelectric plates, each of the first piezoelectric plate and the second piezoelectric plate is a piezoelectric plate in which a longitudinal vibration polarization portion that can excite the longitudinal vibrations and a bending vibration polarization portion that can excite the bending vibrations are polarized in a thickness direction, and the first piezoelectric plate is connected to the driving circuit and the detection circuit, and the second piezoelectric plate is connected to the driving circuit but is not connected to the detection circuit.

BRIEF DESCRIPTION OF THE DRAWINGS

FIG. 4 shows the four types of piezoelectric plates in detail;

FIG. 5 shows an example of stacking the piezoelectric plates for forming a vibrator;

DESCRIPTION OF THE PREFERRED EMBODIMENTS

Figure 1:
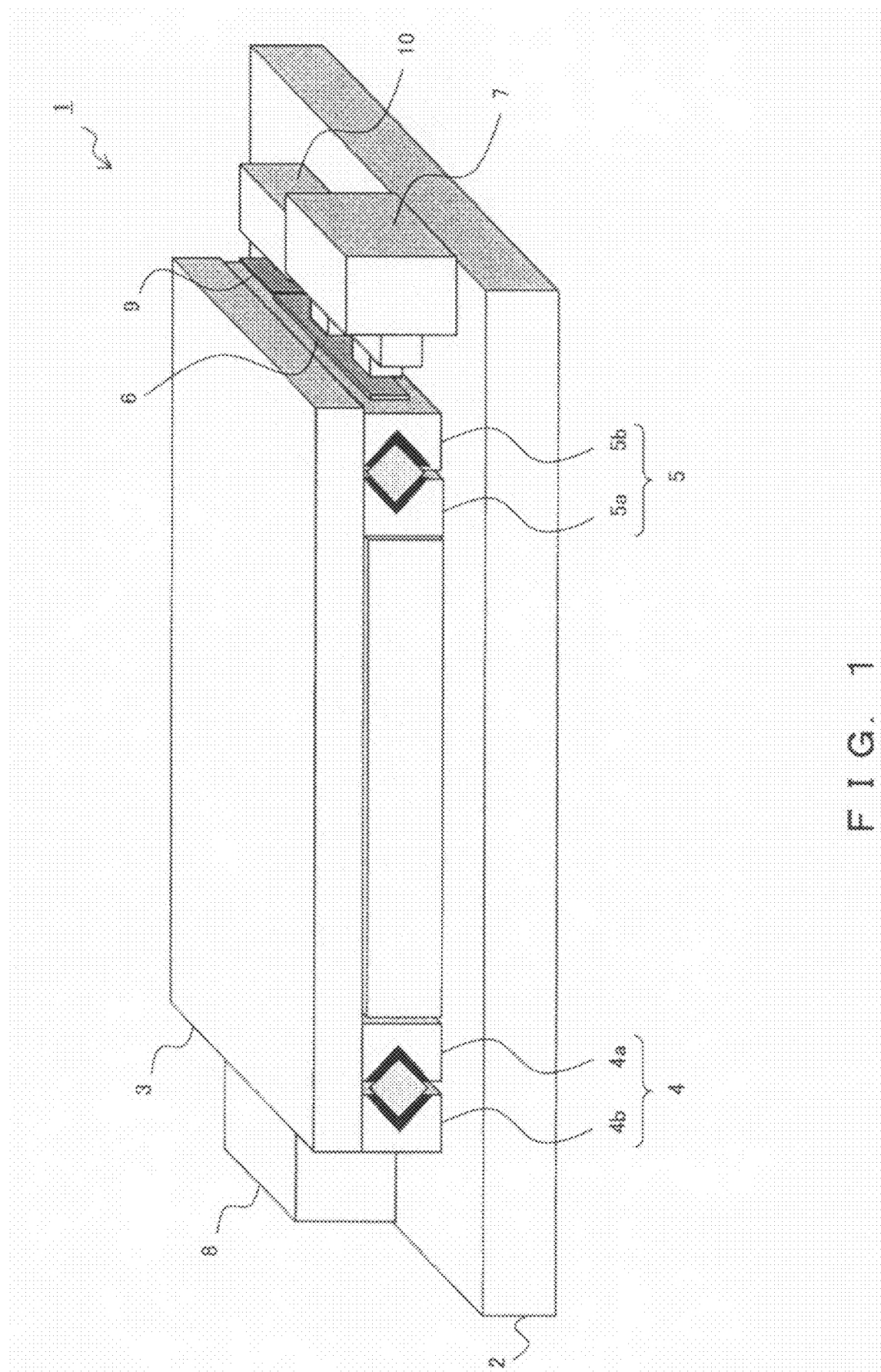
FIG. 1 shows an example of a microscope stage having an ultrasonic motor according to an embodiment of the present invention.

Hereinafter, the embodiments of the present invention will be explained by referring to the drawings.

FIG. 1 shows an example of a microscope stage having an ultrasonic motor according to an embodiment of the present invention.

As shown in FIG. 1, a microscope stage 1 according to the present embodiment comprises a fixed table 2 and a movable table (also referred to as a stage) 3, each of which includes various other constituents. The movable table 3 is supported by the fixed table 2 in such a manner that the movable table 3 can move backward and forward along one axis direction. Guides 4 (4a and 4b) and guides 5 (5a and 5b) that are supporting means such as a cross roller guide assembly are used to support the movable table 3 in such a manner that the movable table 3 can move backward and forward along one axis direction. These guides 4 and 5 are fixed to the top surface of the fixed table 2 and to the bottom surface of the movable table 3.

Sliding plates are attached to the side surfaces of the guides 4b and 5b fixed to the bottom surface of the movable table 3 (the sliding plate attached to the side surface of the guide 4b is not shown in FIG. 1, and the sliding plate attached to the side surface of the guide 5b is denoted by numeral 6). Each of the sliding plates is desirably attached in such a manner that the longitudinal center line of the sliding plate is parallel to the moving direction of the movable table 3 and is on the plane that contains the center lines in the guiding directions of the guides 4b and 5b. However, the scope of the present invention is not limited to this manner. Also, the longitudinal length of the sliding plate is equal to or greater than the length over which the movable table 3 moves with respect to the fixed table 2.

Ultrasonic motors 7 and 8 are arranged in such a manner that they are fixed to the top surface of the fixed table 2 and respectively contact with the sliding plates. By this arrangement, the ultrasonic motors 7 and 8 are opposite to each other, having the movable table 3 disposed between them.

Figure 2:
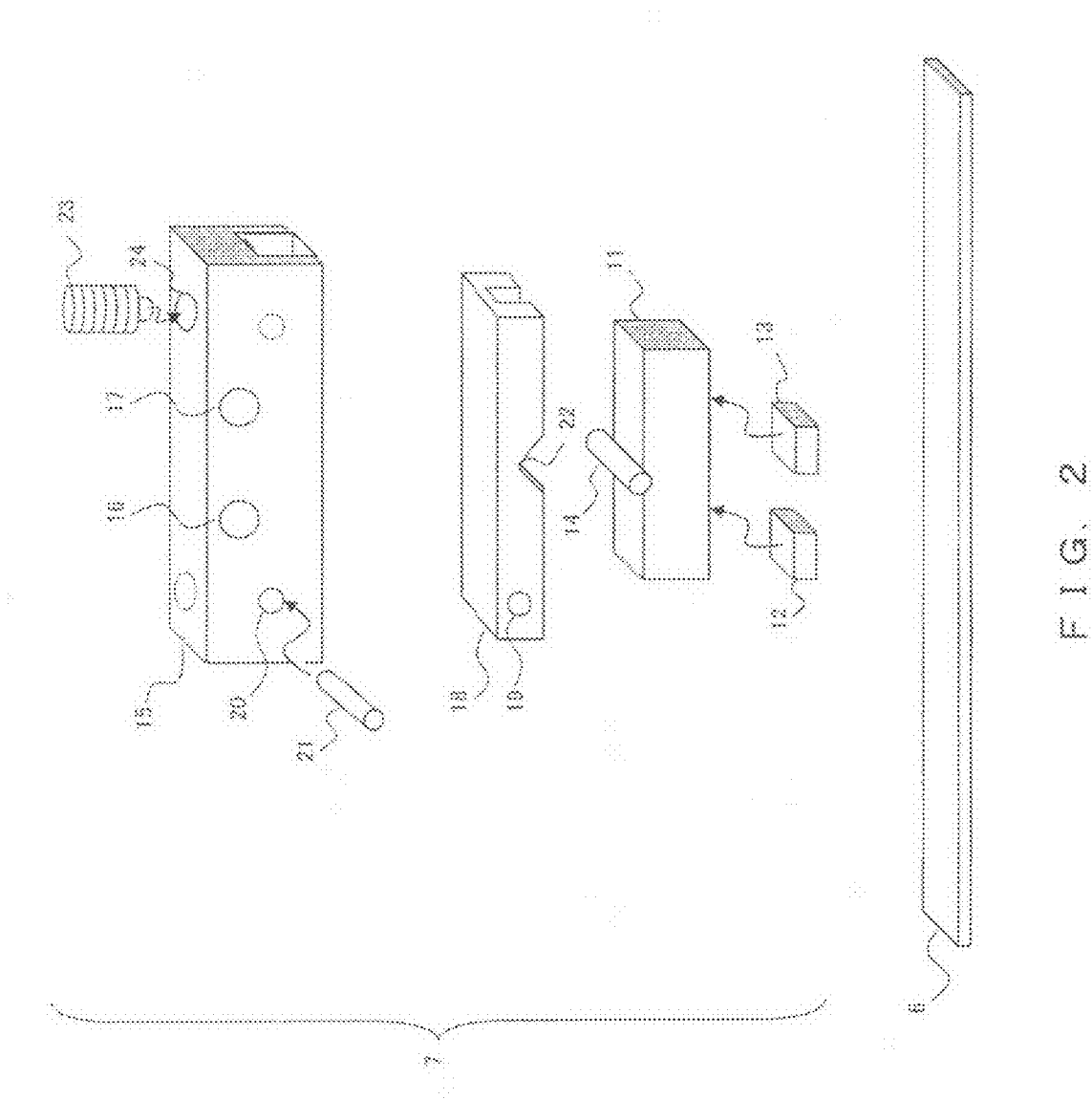
FIG. 2 shows a configuration of the ultrasonic motor in detail.

In FIG. 1, the ultrasonic motors 7 and 8 are shown in a simplified manner, and actually the ultrasonic motors 7 and 8 have the configuration shown in FIG. 2 (FIG. 2 will be explained later). Also, this microscope stage 1 is configured in such a manner that the two driving elements of the ultrasonic motor 7 are always in a contacting state with the sliding plate 6 and two driving elements of the ultrasonic motor 8 are also always in a contacting state with another sliding plate (not shown) within the movement range of the movable table 3 with respect to the fixed table 2.

A linear scale 9 is fixed to a side surface of the guide 5b that is fixed to the bottom surface of the movable table 3. The linear scale 9 is attached in such a manner that the longitudinal center line of the linear scale 9 is parallel to the movement direction of the movable table 3 and is on the plane that contains the center lines in the guiding directions of the guides 4b and 5b. However, the linear scale 9 can be attached to an arbitrary position as long as the linear scale 9 is fixed to the movable table 3 in such a manner that the longitudinal center line of the linear scale 9 is parallel to the movement direction of the movable table 3.

A sensor head 10 is fixed to the top surface of the fixed table 2 and faces the linear scale 9.

Additionally, the microscope stage 1 can employ a configuration in which the pair of the fixed table 2 and the movable table 3 has a hole at the center in order to allow light to pass through it so that various methods of observation can be realized.

FIG. 2 shows in detail the configuration of the above ultrasonic motor. Ultrasonic motors 7 and 8 have the same configuration, thus only ultrasonic motor 7 is explained.

In FIG. 2, two driving elements 12 and 13 are attached to a vibrator 11 that vibrates when electric signals are applied thereto, and the driving elements 12 and 13 contact with the sliding plate 6 under a constant pressure. A supporting pin 14 is fixed to the top surface of the vibrator 11 by means of the adhesion or the like.

A fixed member 15 is fixed to the fixed table 2 by means of screws or the like via fixation screw holes 16 and 17. Also, the fixed member 15 has a groove whose width is large enough to accommodate a supporting member 18. By inserting a fixation pin 21 into fixation pin holes 19 and 20 respectively on the supporting member 18 and the fixed member 15 when the supporting member 18 is accommodated in the groove in the fixed member 15, they are fixed to each other. In this state, the supporting member 18 is fixed to the fixed member 15 in such a manner that the supporting member 18 can swing about the fixation pin 21 with respect to the fixed member 15.

The supporting pin 14 fixed to the top surface of the vibrator 11 is supported without any play by a V-groove-shaped supporting-pin-accommodation part 22 that is provided on the lower portion of the supporting member 18.

Figure 3:
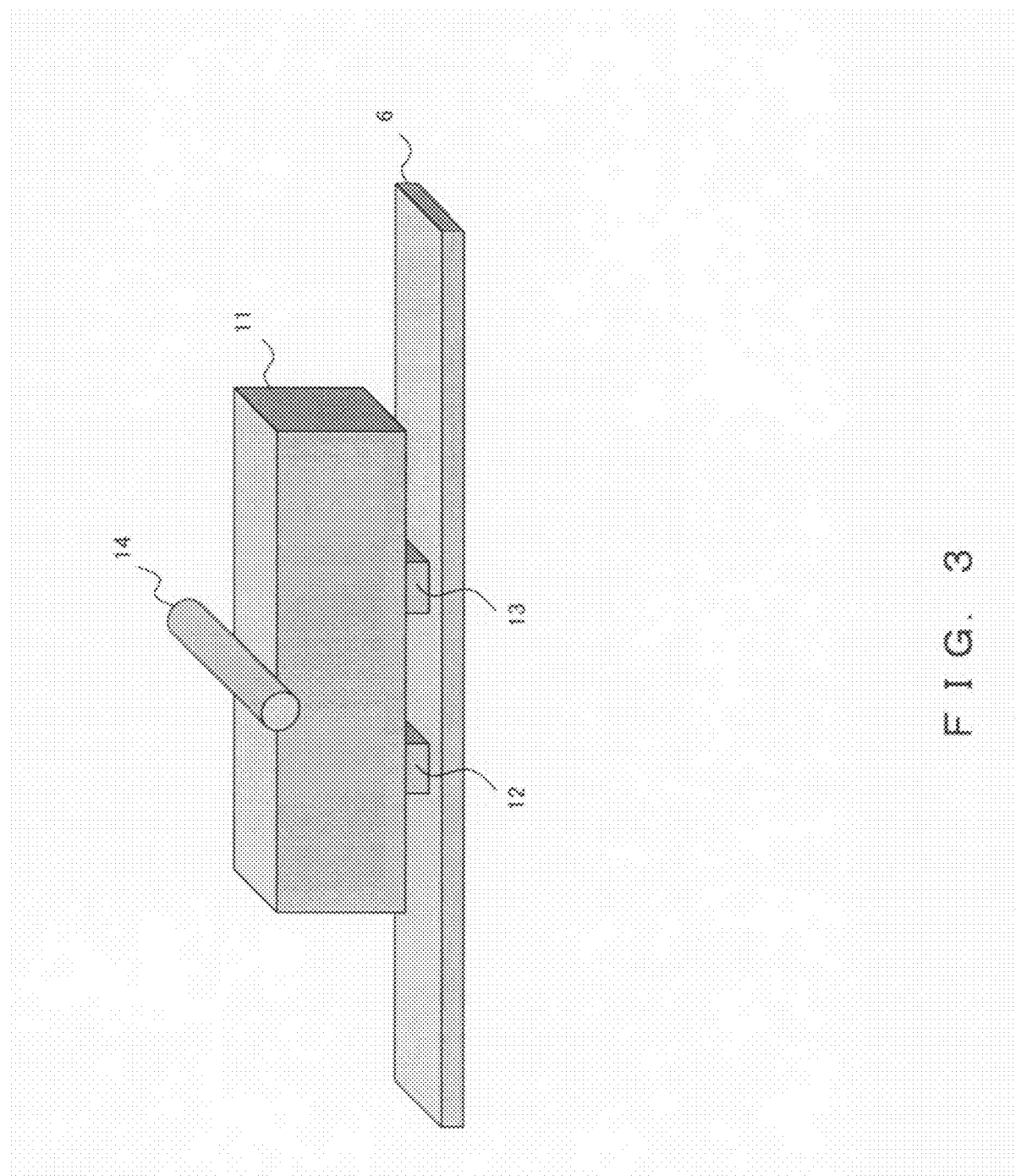
FIG. 3 shows a state of a part of the ultrasonic motor in which driving elements are pressed to a sliding plate by the pressure (F) applied to a supporting pin.

The pressing force under which the driving elements 12 and 13 touch the sliding plate 6 is applied by a pressing member 23 such as a plunger. As is a common practice in the technical field, a male thread is formed on the pressing member 23. Because of this, the pressing member 23 is screwed into a pressing-member tap 24 provided in the fixed member 15. When being screwed in, the tip portion of the pressing member 23 abuts the top surface of the supporting member 18. Then, the supporting member 18 swings about the fixation pin 21. By this swinging, pressure is applied to the supporting pin 14 in the pressing direction of the pressing member 23, said supporting pin 14 being in contact, without any play, with the V-groove-shaped supporting-pin-accommodation part 22 in the lower portion of the supporting member 18. Accompanying this, the driving elements 12 and 13 are pressed to the sliding plate 6 because the driving elements 12 and 13, the supporting pin 14, and the vibrator 11 are fixed into one piece. When the pressing member 23 is screwed in further, the pressing force further increases. FIG. 3 shows the state of a part of the ultrasonic motor in which the driving elements 12 and 13 are pressed to the sliding plate 6 by the pressure (F) applied to the supporting pin 14.

The ultrasonic motor 7 configured as above excites the longitudinal vibrations (also referred to as the stretching vibrations) and the bending vibrations at the same time, and thereby elliptical vibrations are caused at the position at which the driving elements 12 and 13 attached to the vibrator 11 contact with the sliding plate 6 in order to move the movable table 3 in desired directions.

The configuration of the vibrator 11 is explained in detail by referring to FIGS. 4 and 5.

The vibrator 11 is a stacked-type piezoelectric body that is configured by stacking, in the thickness direction, a plurality of rectangular piezoelectric plates. As the plurality of piezoelectric plates, four types of piezoelectric plates are used.

FIG. 4 shows the four types of piezoelectric plates in detail.

In FIG. 4, a piezoelectric plate 31 is an inactive piezoelectric plate without an electrode. A piezoelectric plate 32 includes bending vibration electrodes 33a, 33b, 33c, and 33d (this group is also referred to as bending vibration electrodes 33) serving as driving electrodes and a longitudinal vibration detection electrode 34. A piezoelectric plate 35 includes bending vibration electrodes 36a, 36b, 36c, and 36d (this group is also referred to as bending vibration electrodes 36) serving as driving electrodes and a longitudinal vibration electrode 37 serving as a driving electrode. A piezoelectric plate 38 includes a GND (ground) electrode 39.

In each of the piezoelectric plates 32 and 35, a longitudinal vibration polarization portion for exciting the longitudinal vibrations and a bending vibration polarization portion for exciting the bending vibrations are polarized in the thickness direction. Also, in the piezoelectric plate 32, the above bending vibration electrodes 33 are formed for the corresponding bending vibration polarization portions, and the above longitudinal vibration detection electrode 34 is formed for the longitudinal vibration polarization portion. Also, in the piezoelectric plate 35, the above bending vibration electrodes 36 are formed for the corresponding bending vibration polarization portion, and the above longitudinal vibration electrode 37 is formed for the longitudinal vibration polarization portion. In FIG. 4, the symbols "+" and "−" represent the polarization directions of the corresponding polarization portions, and the combination of "+" and "−" represents the directions of polarization are opposed to each other. Additionally, all the polarization directions may be "+" or may be "−"; however, if this is so, the driving alternating current signals that are applied have to be reversed in accordance with the symbols in FIG. 4.

The bending vibration electrodes 33 in the piezoelectric plate 32 and the bending vibration electrodes 36 in the piezoelectric plate 35 have the same shape. Also, the longitudinal vibration detection electrode 34 in the piezoelectric plate 32 and the longitudinal vibration electrode 37 in the piezoelectric plate 35 have the same shape. The GND electrode 39 in the piezoelectric plate 38 has substantially the same shape as that of a part that is formed by connecting the longitudinal vibration electrode 37 and the bending vibration electrodes 36 in the piezoelectric plate 35 together (or a part that is formed by connecting the longitudinal vibration detection electrode 34 and the bending vibration electrodes 33 in the piezoelectric plate 32). Due to this shape of the GND electrode 39, it is possible to prevent the lead traces (will be described later) from contributing to the deformation of the piezoelectric plates. Thereby, unnecessary deformation can be avoided so that vibration amplitude can be achieved efficiently.

The bending vibration electrodes 33 in the piezoelectric plate 32 are respectively provided with lead traces 40a, 40b, 40c, and 40d (also referred to as lead traces 40) for allowing electric connections with external circuits. Similarly, the longitudinal vibration detection electrode 34 is provided with a lead trace 41. Also, the bending vibration electrodes 33 and the longitudinal vibration detection electrode 34 are respectively symmetrical with respect to the plane YZ that contains the center point in the X direction of the piezoelectric plate 32. Also, the lead traces 40a and 40b are symmetrical with respect to this plane YZ, and the lead traces 40d and 40c are symmetrical with respect to the plane YZ similarly. The X, Y, and Z directions are as indicated in FIG. 4 here and throughout in this document.

The bending vibration electrodes 36 in the piezoelectric plate 35 are respectively provided with lead traces 42a, 42b, 42c, and 42d (also referred to as lead traces 42) to allow electric connections with external circuits. Similarly, the longitudinal vibration electrode 37 is provided with a lead trace 43. Also, the lead trace 43 in the piezoelectric plate 35 and the lead trace 41 in the piezoelectric plate 32 are symmetrical with respect to the plane XY containing the center point in the X direction of the piezoelectric plate 35 (when the piezoelectric plate 35 and the piezoelectric plate 32 are stacked on each other). Also, the bending vibration electrodes 36 and the longitudinal vibration electrode 37 are respectively symmetrical with respect to the plane YZ that contains the center point in the X direction of the piezoelectric plate 35. Also, the lead traces 42a and 42b are symmetrical with respect to this plane YZ, and the lead traces 42d and 42c are symmetrical with respect to the plane YZ similarly.

The GND electrode 39 in the piezoelectric plate 38 is provided with lead traces 44a and 44b (also referred to as the lead traces 44) to allow electric connections with external circuits. Additionally, the GND electrode 39 is symmetrical with respect to the plane YZ containing the center point in the X direction of the piezoelectric plate 38. The lead traces 44a and 44b are symmetrical with respect to this plane YZ.

By stacking these four types of piezoelectric plates in a prescribed order, the vibrator 11 is formed.

FIG. 5 shows an example of stacking the piezoelectric plates to form the vibrator 11.

As shown in FIG. 5, in this example, one piezoelectric plate 31, two piezoelectric plates 32, two piezoelectric plates 35, and three piezoelectric plates 38 are stacked in the order of 32, 38, 35, 38, 35, 38, 32, and 31 starting from the farthest to the nearest plate in the figure. In this figure, the piezoelectric plates 32, 35, and 38 are stacked in such a manner that each of them has its electrode on the surface that faces the nearer side in the figure. Thereby, the electrode plane is not exposed to the external environment. Also, by stacking in this manner, the ends of the respective lead traces of the piezoelectric plates 32, 35, and 38 are exposed to the external environment from the side surfaces of the vibrator 11.

Also, the number of piezoelectric plates forming the vibrator 11 is not limited to this example, and the number of piezoelectric plates can be arbitrarily selected according to necessity as long as the piezoelectric plates 32 or the piezoelectric plates 35 and the piezoelectric plates 38 are stacked alternatingly and the piezoelectric plate 31 is arranged as the top layer (the nearest side in the figure). It is also possible to arrange the piezoelectric plate 31 as the bottom layer (the farthest side in the figure).

Figure 6:
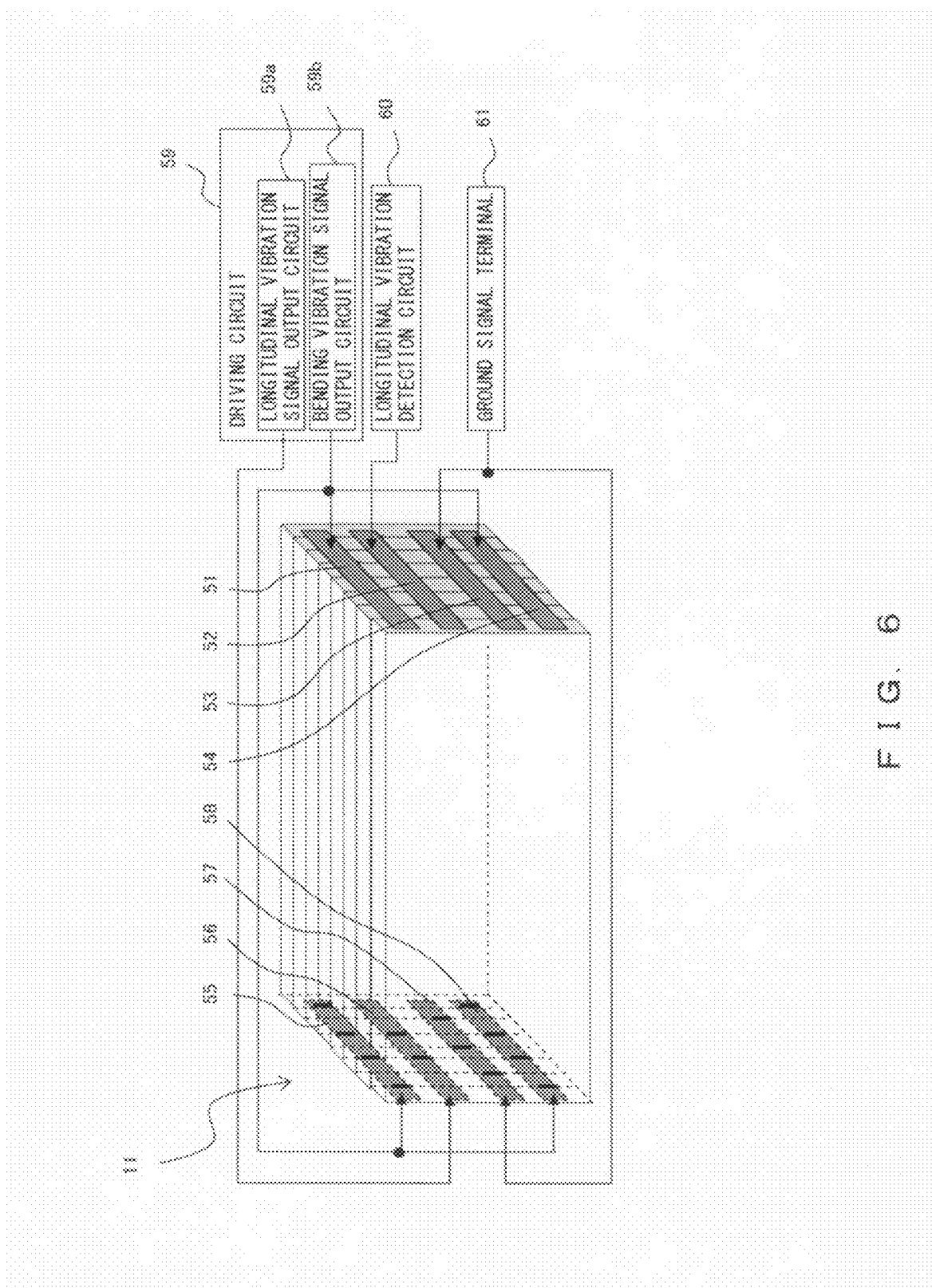
FIG. 6 shows an example of electric connections of the vibrator shown in FIG. 5.

FIG. 6 shows an example of the electric connections of the vibrator 11 shown in FIG. 5.

As shown in FIG. 5, from the side surfaces of the vibrator 11, the lead traces of the respective piezoelectric plates (except for the piezoelectric plate 31) are exposed to the external environment. Accordingly, by forming, on the side surfaces of the vibrator 11 and in the stacking direction, elongate electrode traces having arbitrary widths as shown in FIG. 6, the common electrodes are electrically connected.

Specifically, an electrode trace 51 is formed on a side surface of the vibrator 11 in order to electrically connect all the lead traces 40b and 42b in the vibrator 11, and thereby all of the bending vibration electrodes 33b and 36b are brought into electrical conduction.

Also, an electrode trace 52 is formed on a side surface of the vibrator 11 in order to electrically connect all the lead traces 41 in the vibrator 11, and thereby all of the longitudinal vibration detection electrodes 34 are brought into electrical conduction.

Also, an electrode trace 53 is formed on a side surface of the vibrator 11 in order to electrically connect all of the lead traces 44a in the vibrator 11, and an electrode trace 57 is formed on the other side surface of the vibrator 11 in order to electrically connect all of the lead traces 44b in the vibrator 11. Thereby, all of the GND electrodes 39 in the vibrator 11 are brought into electrical conduction.

Also, an electrode trace 54 is formed on a side surface of the vibrator 11 in order to electrically connect all of the lead traces 40c and 42c in the vibrator 11, and thereby all of the bending vibration electrodes 33c and 36c in the vibrator 11 are brought into electrical conduction.

Also, an electrode trace 55 is formed on a side surface of the vibrator 11 in order to electrically connect the lead traces 40a and 42a in the vibrator 11, and thereby all of the bending vibration electrodes 33a and 36a in the vibrator 11 are brought into electrical conduction.

Also, an electrode trace 56 is formed on a side surface of the vibrator 11 in order to electrically connect the lead traces 43 in the vibrator 11, and thereby all of the longitudinal vibration electrodes 37 in the vibrator 11 are brought into electrical conduction.

Also, an electrode trace 58 is formed on a side surface of the vibrator 11 in order to electrically connect all of the lead traces 40d and 42d in the vibrator 11, and thereby all of the bending vibration electrodes 33d and 36d in the vibrator 11 are brought into electrical conduction.

Due to the electrode traces formed on the side surfaces of the vibrator 11 as described above, the electrode traces 51, 54, 55, and 58 are electrically connected to a longitudinal vibration signal output circuit 59a in a driving circuit 59. The electrode trace 52 is electrically connected to a longitudinal vibration detection circuit 60. The electrode trace 56 is electrically connected to a bending vibration signal output circuit 59b in the driving circuit 59. The electrode traces 53 and 57 are electrically connected to a ground signal terminal 61. These respective connections are through electrical wiring such as by, for example, lead wires. In the present embodiment, the connections are through lead wires.

The driving circuit 59 is a circuit used for applying driving signals to piezoelectric plates, and the longitudinal vibration detection circuit 60 is a circuit used for detecting an electromotive force generated when the piezoelectric plates deform. The driving circuit 59, the longitudinal vibration detection circuit 60, and the ground signal terminal 61 are included as a part of the configuration of the ultrasonic motor 7. Also, the positions at which the vibrator 11 and the lead wires are connected to each other are approximately symmetrical with respect to the plane YZ that contains the center of the X-direction length of the vibrator 11. Thereby, the symmetry in the weight of the above lead wires connected to the vibrator 11 is maintained so that the imbalance in the weight of the lead wires has no influence.

Next, the operations of the vibrator 11 that has been brought into electrical conduction as described above will be explained.

When the bending vibrations are to be excited in the configuration of FIG. 6, the bending vibration signal output circuit 59b outputs an electric signal that is of a sine wave or a rectangular wave and that has a frequency close to the bending vibration mode. This signal is applied to the bending vibration electrodes 33 and 36 at the same moment via the electrode traces 51, 54, 55, and 58. If, with the signal being applied, the electrode portions having the symbol "+" (polarization portions for bending vibrations) in the piezoelectric plates deform in such a manner that they stretch in the X direction, the electrode portions having the symbol "−" in the piezoelectric plates deform in such a manner that they shorten in the X direction. This combination of deformations is repeated at a frequency close to the bending vibration mode, so that the bending vibration mode is excited, and a great deformation can be caused.

When the longitudinal vibrations are to be excited, the longitudinal vibration signal output circuit 59a outputs an electric signal that is of a sine wave or of a rectangular wave and that has a frequency close to the longitudinal vibration mode. This signal is applied to the longitudinal vibration electrode 37 through the electrode trace 56. In response to this signal, the longitudinal-vibration-electrode portions of the piezoelectric body (polarization portions for longitudinal vibrations in the piezoelectric plates 35) deform in such a manner that they stretch or shrink in the X direction. By repeating this deformation at a frequency close to the longitudinal vibration mode, the longitudinal vibration mode is excited and a great deformation is caused.

Depending on the signals respectively output from the bending vibration signal output circuit 59b and the longitudinal vibration signal output circuit 59a, the deformation directions may be different from each other between the bending-vibration-electrode portions in the piezoelectric plates and the longitudinal-vibration-electrode portions in the piezoelectric plates. When the longitudinal vibration electrodes and the bending vibration electrodes exist at the same time on a plane YZ at an arbitrary position in the X direction of the vibrator 11, the two types of electrode portions tend to deform in opposite directions so that the deformations conflict with each other, which reduces the efficiency in achieving the vibration amplitude. However, in the configuration according to the present embodiment, the bending vibration electrodes and the longitudinal vibration electrodes do not exist at the same time on the plane YZ; accordingly, the deformation of the two types of the electrode portions do not conflict with each other, and accordingly the vibration amplitude can be achieved efficiently.

Also, the vibration amplitude of the longitudinal vibration mode in accordance with the electric signal applied to the longitudinal vibration electrode 37 can be achieved. However, the signal in accordance with the magnitude of the longitudinal vibration amplitude is generated as the counter electromotive force in the longitudinal vibration detection electrode 34. The polarization direction of the longitudinal-vibration-detection electrode portion in the piezoelectric plate (the polarization direction of the longitudinal vibration polarization portion in the piezoelectric plate 32) is indicated by the symbol "−" i.e., the opposite to the symbol "+" of the polarization direction of the longitudinal-vibration-electrode portion in the piezoelectric plate (the polarization direction of the longitudinal vibration polarization portion in the piezoelectric plate 35). Accordingly, the polarization of the electric signal in accordance with the extension or shortening direction is the same as that of the polarization of the driving signal and the polarization of the detection signal. By detecting this detection signal by using the longitudinal vibration detection circuit 60, it is possible to monitor the magnitude of the longitudinal vibration amplitude.

Also, the signal output from the longitudinal vibration signal output circuit 59a to the longitudinal vibration electrodes 37 and the signal output from the bending vibration signal output circuit 59b to the bending vibration electrodes 33 and 36 are also input into the ground signal terminal 61 via the GND electrode 39. Because there are two paths (the path via the electrode trace 53 and the path via the electrode trace 57) between the GND electrodes 39 and the ground signal terminal 61, the flowing current is divided into two. As a result, a smaller amount of current flows on each path. Thereby, it is possible to use lead lines that have a small diameter and are soft and light in weight to connect the electrode traces 53 and 57 with the ground signal terminal 61. Accordingly, the lead lines do not affect the vibrations of the vibrator 11.

As described above, according to the present embodiment, it is possible to efficiently achieve a stable vibration amplitude, and also to monitor the actual vibration amplitude in the ultrasonic motor included in the microscope stage 1. Also, accompanying this, in the microscope stage 1, it is possible to reduce the deterioration in the movement characteristics of the table caused by the friction variation in order to move the movable table 3 stably.

In the present embodiment, it is also possible to use, as the longitudinal vibration electrode, the longitudinal vibration detection electrodes 34 in the piezoelectric plates 32 of the vibrator 11 and to use, as the longitudinal vibration detection electrode, the longitudinal vibration electrodes 37 in the piezoelectric plates 35. However, in that case, the wiring configuration is reversed.

Also, as shown in FIG. 6, the magnitude of the longitudinal vibration amplitude in the vibrator 11 is monitored in the present embodiment. However, it is also possible to monitor the magnitude of the bending vibration amplitude in the vibrator 11, in addition to the magnitude of the longitudinal vibration amplitude.

Figure 7:
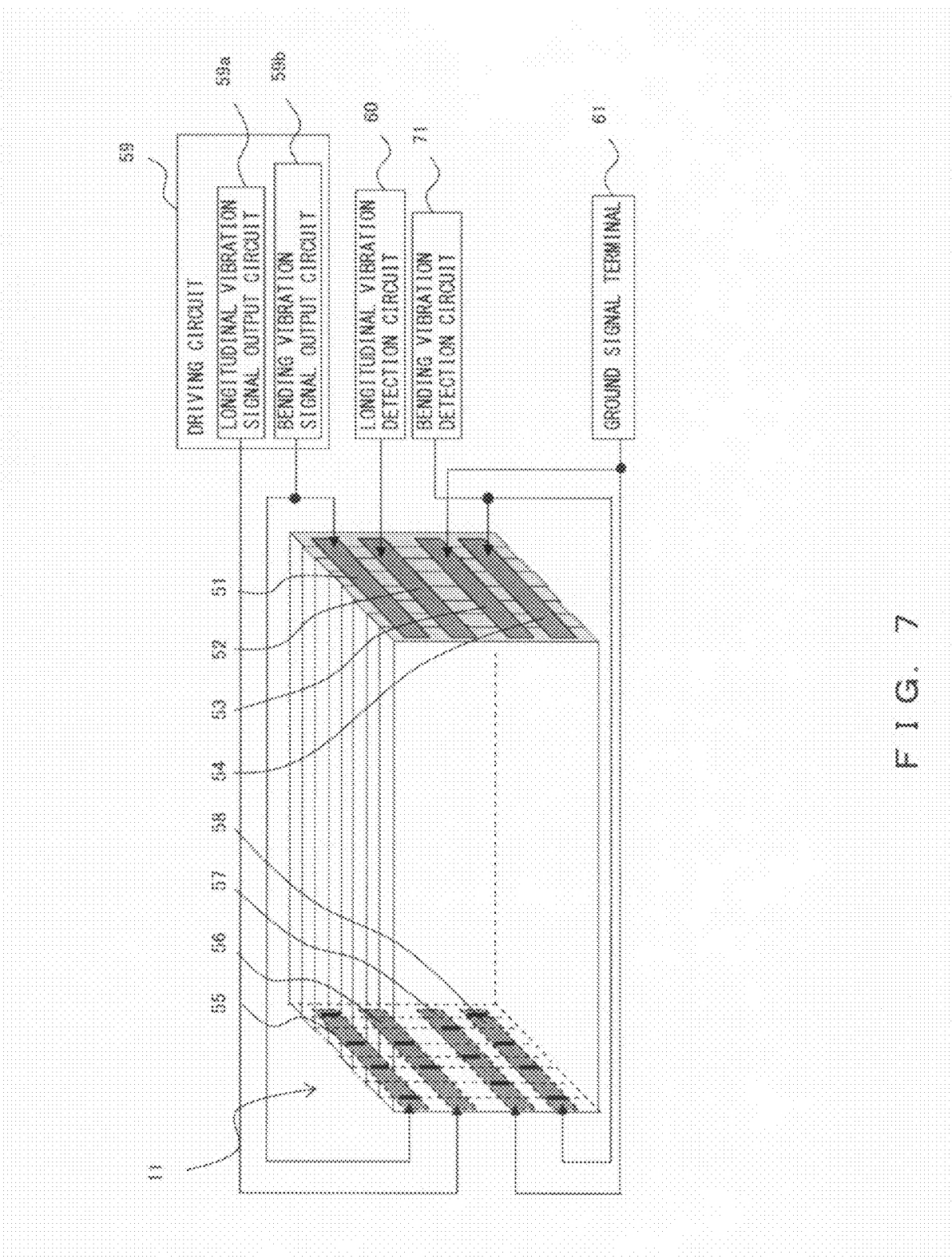
FIG. 7 shows an example of an electrical connection configuration in the vibrator for additionally monitoring the magnitude of bending vibration amplitude.

FIG. 7 shows an example of an electrical connection configuration in the vibrator 11 for the above additional monitoring.

The example shown in FIG. 7 is different from that shown in FIG. 6 in that a bending vibration detection circuit 71 is additionally provided for monitoring the magnitude of the bending vibration amplitude, the electrodes 33c, 33d, 36c, and 36d that were used as the bending vibration electrodes in the example in FIG. 6 are used as the bending vibration detection electrodes, and these electrodes are electrically connected to the bending vibration detection circuit 71 via the electrode traces 54 and 58. Additionally, accompanying this, the bending vibration signal output circuit 59b is connected only to the electrode traces 51 and 55.

According to this configuration, the vibration amplitude in the bending vibration mode in accordance with the electric signal applied to the bending vibration electrodes 33a, 33b, 36a, and 36b is achieved, and at that time, a signal in accordance with the magnitude of the bending vibration amplitude is generated as the counter electromotive force in the bending vibration detection electrodes 33c, 33d, 36c, and 36d. By detecting the signal generated as the counter electromotive force as a detection signal by using the bending vibration detection circuit 71, it is possible to monitor the magnitude of the bending vibration amplitude.

Thereby, it is possible to monitor the magnitude of the bending vibration amplitude in addition to the magnitude of the longitudinal vibration amplitude in the vibrator 11. Also, this additional monitoring does not require any additional wiring.

Additionally, in the example shown in FIG. 7, the bending vibration electrodes 33c, 33d, 36c, and 36d shown in FIG. 4 are used for the detection of the amplitude of the bending vibrations. However, instead of these, the bending vibration electrodes 33a, 33b, 36a, and 36b can be used, as a matter of course.

As described above, the longitudinal vibration electrodes and the bending vibration electrodes can be used both for driving and/or for vibration detection, accordingly all the electrodes can be used for driving when a large amount of force is required.

Also, in the present embodiment, the vibrator 11 is formed by using the four types of piezoelectric plates shown in FIG. 4. However, it is also possible to form a vibrator by using piezoelectric plates having a smaller number of electrodes for the purpose of reducing the number of assembly steps. Also, accompanying the number of electrodes, it is possible to reduce the number of lead traces, the number of electrode traces, and the number of lead lines.

Figure 8:
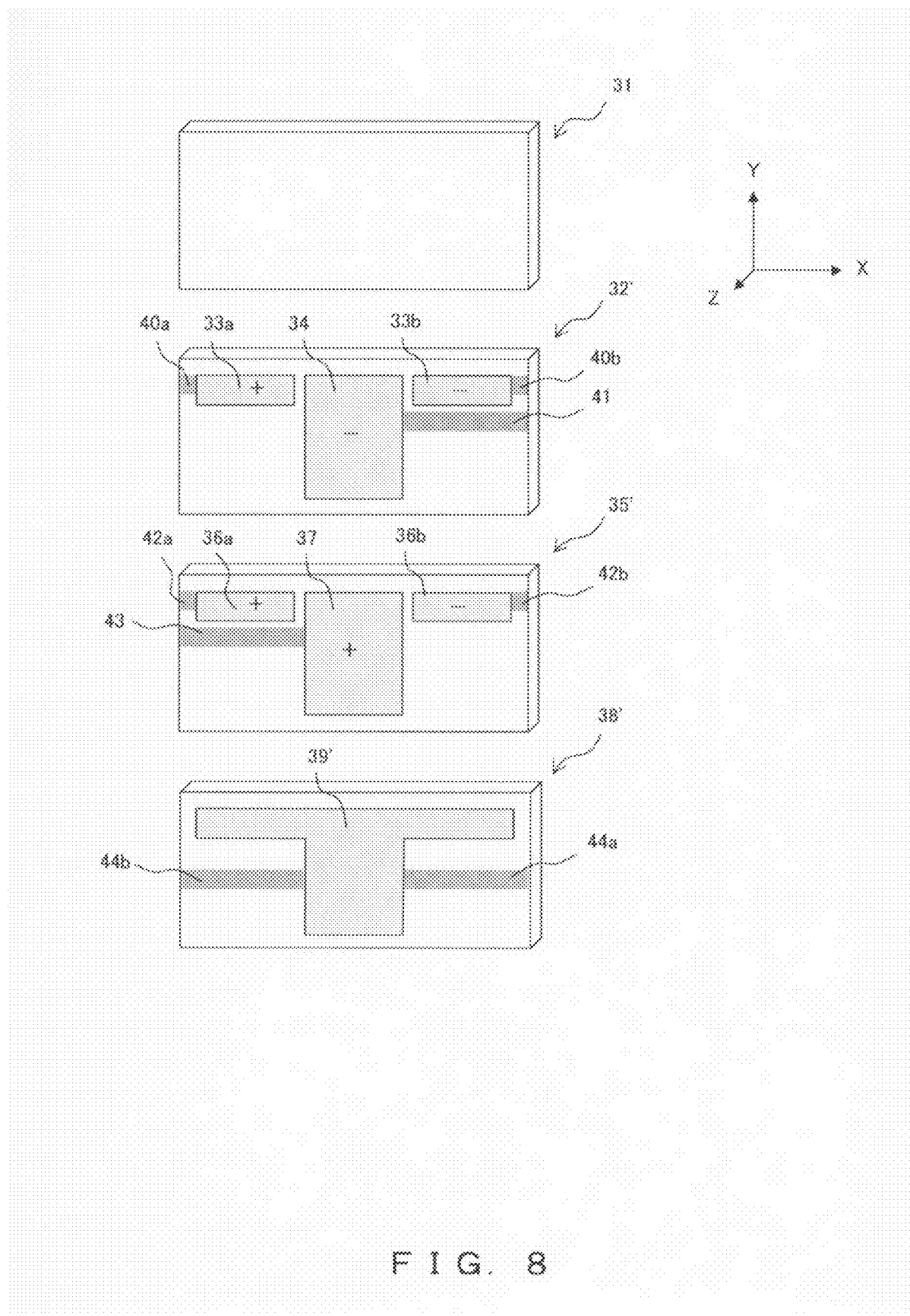
FIG. 8 shows the four types of piezoelectric plates for forming the vibrator in the case when the number of electrodes is reduced.

FIG. 8 shows four types of piezoelectric plates for forming the vibrator in the case when the number of electrodes is reduced as described above.

In FIG. 8, the piezoelectric plate 31 is the same as the piezoelectric plate 31 shown in FIG. 4.

A piezoelectric plate 32' is obtained by removing from the piezoelectric plate 32 in FIG. 4 the bending vibration electrodes 33c and 33d and the lead traces 40c and 40d. Also, accompanying this, only the bending vibration electrodes 33a and 33b and the longitudinal vibration detection electrode 34 function as the polarization portion in the piezoelectric plate 32'.

A piezoelectric plate 35' is obtained by removing from the piezoelectric plate 35 in FIG. 4 the bending vibration electrodes 36c and 36d and the lead traces 42c and 42d. Also, accompanying this, only the bending vibration electrodes 36a and 36b and the longitudinal vibration electrode 37 function as the polarization portion in the piezoelectric plate 35'.

A piezoelectric plate 38' is a piezoelectric plate that has a GND electrode 39' obtained by removing from the GND electrode 39 in FIG. 4 the GND electrode portion corresponding to the above removed bending vibration electrodes 33c, 33d, 36c, and 36d.

The configuration shown in FIG. 8 has the same configuration as that shown in FIG. 4 in the points other than the above points.

Figure 9:
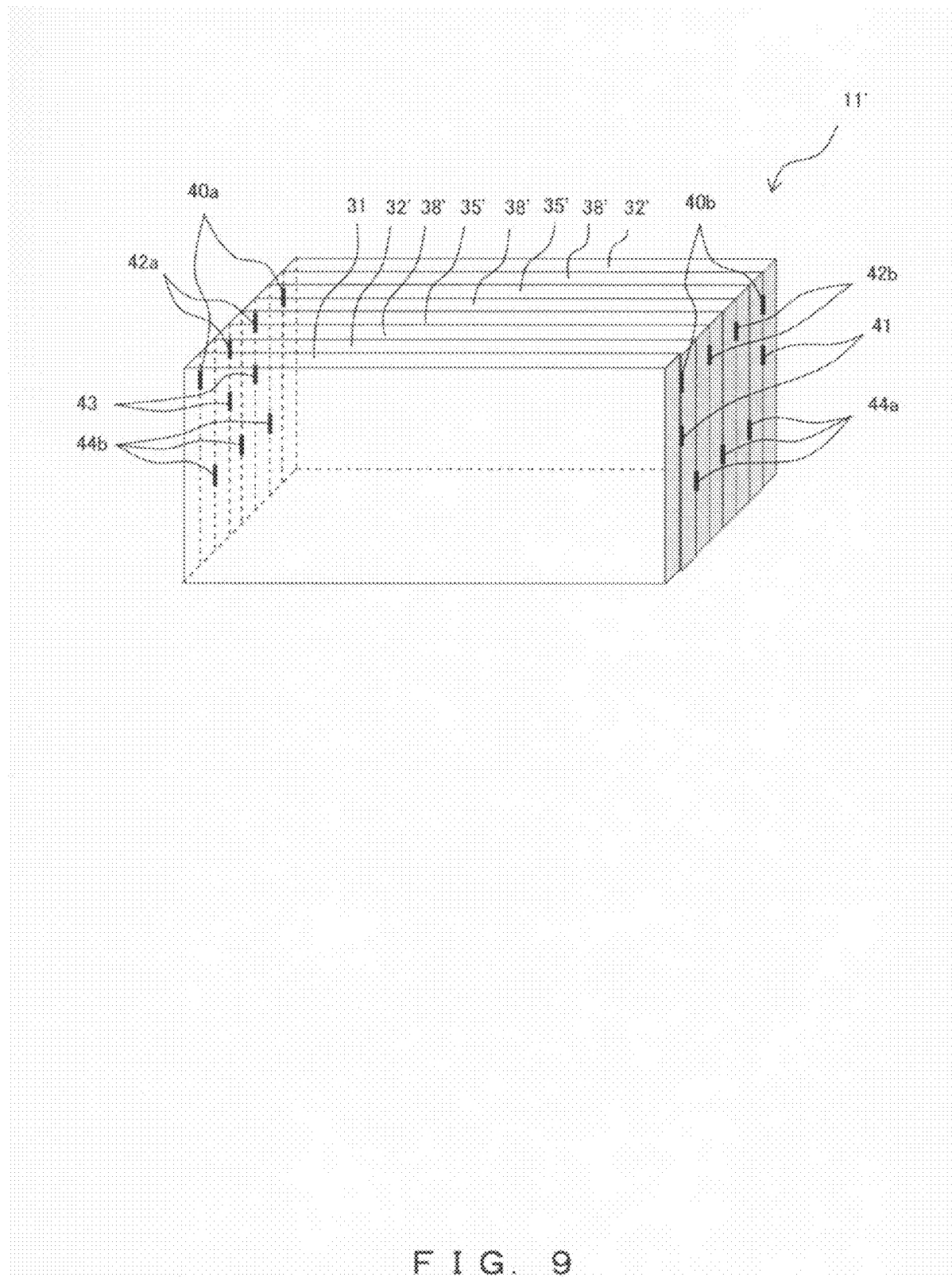
FIG. 9 shows a vibrator formed by stacking the four types of the piezoelectric plates shown in FIG. 8.

FIG. 9 shows a vibrator 11' formed by stacking the above four types of piezoelectric plates 31, 32', 35', and 38'. As shown in FIG. 9, the lead traces 40c, 40d, 42c, or 42d shown in FIG. 5 are not on the side surface of the vibrator 11'; accordingly, there is no exposure of the lead traces 40c, 40d, 42c, or 42d. This vibrator 11' has the same configuration as that shown in FIG. 5 in the points other than this absence of lead traces 40c, 40d, 42c, and 42d.

Figure 10:
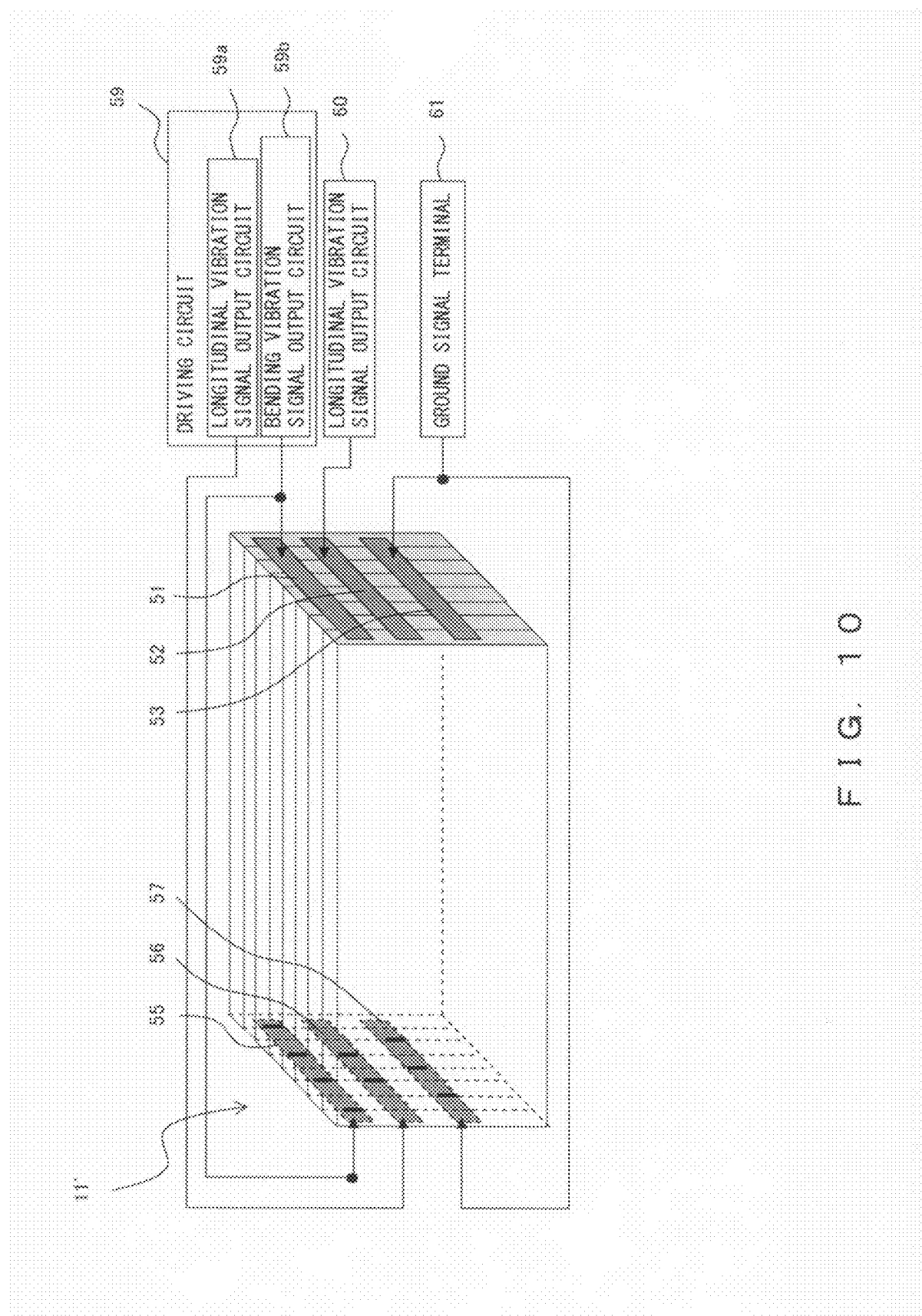
FIG. 10 shows an example of an electrical connection configuration of the vibrator shown in FIG. 9.

FIG. 10 shows an example of an electrical connection configuration of the vibrator 11' shown in FIG. 9.

As shown in FIG. 10, since the side surface of the vibrator 11' does not need the electrode trace 54 or 58 shown in FIG. 6, there is no electrode trace forming for them. Also, accompanying this, the bending vibration signal output circuit 59b is connected only to the electrode traces 51 and 55. The vibrator 11' has the same configuration as the vibrator 11 shown in FIG. 6 except for the above points.

By employing this configuration, it is possible to reduce the number of electrodes, the number of lead traces, the number of electrode traces, and the number of lead lines, so that the number of assembly steps can be reduced. Also, this configuration is advantageous when a large amplitude in the bending vibrations is not required.

Also, in the examples shown in FIGS. 8 through 10, the bending vibration electrodes 33c, 33d, 36c, and 36d shown as the electrodes in FIG. 4 are omitted. However, instead of omitting them, it is also possible to omit the bending vibration electrodes 33a, 33b, 36a, and 36b in order to reduce the number of electrodes, the number of lead traces, the number of electrode traces, and the number of lead lines.

The present invention has been explained in detail. However, it is naturally appreciated that the scope of the present invention is not limited to any one of the above embodiments, and various alterations and modifications are allowed without departing from the spirit of the present invention.

As described above, according to the present invention, in ultrasonic motors, it is possible to efficiently achieve stable vibration amplitude and to monitor the actual vibration amplitude. Also, in microscope stages having ultrasonic motors according to the present invention, it is possible to reduce the deterioration of the operation characteristics caused by friction variations, and to move the microscope stages stably.

What is claimed is:

1. An ultrasonic motor for causing elliptical vibrations at a contacting point with a driven object by utilizing bending vibrations and longitudinal vibrations, comprising:
   a vibrator formed by stacking a plurality of rectangular piezoelectric plates in a thickness direction;
   a driving circuit for applying a driving signal to a piezoelectric plate; and
   a detection circuit for detecting an electromotive force generated when a piezoelectric plate deforms,
   wherein:
      the plurality of rectangular piezoelectric plates include a first piezoelectric plate and a second piezoelectric plate;
      in each of the first piezoelectric plate and the second piezoelectric plate, a longitudinal vibration polarization portion that can excite the longitudinal vibrations and a bending vibration polarization portion that can excite the bending vibrations are polarized in a thickness direction;
      the first piezoelectric plate is connected to the driving circuit and the detection circuit, and the second piezoelectric plate is connected to the driving circuit and is not connected to the detection circuit; and
      in each of the first piezoelectric plate and the second piezoelectric plate, a longitudinal vibration electrode provided for the longitudinal vibration polarization portion and a bending vibration electrode provided for the bending vibration polarization portion are not included in a same plane that is perpendicular to a vibration direction of the longitudinal vibrations.

2. The ultrasonic motor according to claim 1, wherein:
a polarization direction of a part of the polarization portions of the first piezoelectric plate is opposed to a polarization direction of a corresponding part of the polarization portions of the second piezoelectric plate.

3. The ultrasonic motor according to claim 1, wherein:
a GND electrode in the vibrator has a shape that is substantially the same as a shape obtained by connecting the longitudinal vibration electrode and the bending vibration electrode of one of the first and second piezoelectric plates.

4. The ultrasonic motor according to claim 3, wherein:
the GND electrode is connected to an external environment via a plurality of electric lines.

5. The ultrasonic motor according to claim 4, wherein:
positions at which electric lines are connected to the vibrator are substantially symmetrical with respect to a plane perpendicular to the vibration direction of the longitudinal vibrations, said plane containing a center point of a length of the vibrator in the vibration direction of the longitudinal vibrations.

6. A microscope stage having an ultrasonic motor for causing elliptical vibrations at a contacting point with a driven object by utilizing bending vibrations and longitudinal vibrations, said ultrasonic motor comprising:
   a vibrator formed by stacking a plurality of rectangular piezoelectric plates in a thickness direction;
   a driving circuit for applying a driving signal to a piezoelectric plate; and
   a detection circuit for detecting an electromotive force generated when a piezoelectric plate deforms,
   wherein:
      the plurality of rectangular piezoelectric plates include a first piezoelectric plate and a second piezoelectric plate;
      in each of the first piezoelectric plate and the second piezoelectric plate, a longitudinal vibration polarization portion that can excite the longitudinal vibrations and a bending vibration polarization portion that can excite the bending vibrations are polarized in a thickness direction;
      the first piezoelectric plate is connected to the driving circuit and the detection circuit, and the second piezoelectric plate is connected to the driving circuit and is not connected to the detection circuit; and
      in each of the first piezoelectric plate and the second piezoelectric plate, a longitudinal vibration electrode provided for the longitudinal vibration polarization portion and a bending vibration electrode provided for the bending vibration polarization portion are not included in a same plane that is perpendicular to a vibration direction of the longitudinal vibrations.

7. The microscope stage according to claim 6, wherein:
a polarization direction of a part of the polarization portions of the first piezoelectric plate is opposed to a polarization direction of a corresponding part of the polarization portions of the second piezoelectric plate.

8. The microscope stage according to claim 6, wherein:
a GND electrode in the vibrator has a shape that is substantially the same as a shape obtained by connecting the longitudinal vibration electrode and the bending vibration electrode of one of the first and second piezoelectric plates.

9. The microscope stage according to claim 8, wherein:
the GND electrode is connected to an external environment via a plurality of electric lines.

10. The microscope stage according to claim 9, wherein:
positions at which electric lines are connected to the vibrator are substantially symmetrical with respect to a plane perpendicular to the vibration direction of the longitudinal vibrations, said plane containing a center point of a length of the vibrator in the vibration direction of the longitudinal vibrations.

11. An ultrasonic motor for causing elliptical vibrations at a contacting point with a driven object by utilizing bending vibrations and longitudinal vibrations, comprising:
   a vibrator formed by stacking a plurality of rectangular piezoelectric plates in a thickness direction;

a driving circuit for applying a driving signal to a piezoelectric plate; and a detection circuit for detecting an electromotive force generated when a piezoelectric plate deforms, wherein:

the plurality of rectangular piezoelectric plates include a first piezoelectric plate and a second piezoelectric plate;

in each of the first piezoelectric plate and the second piezoelectric plate, a longitudinal vibration polarization portion that can excite the longitudinal vibrations and a bending vibration polarization portion that can excite the bending vibrations are polarized in a thickness direction;

the first piezoelectric plate is connected to the driving circuit and the detection circuit, and the second piezoelectric plate is connected to the driving circuit and is not connected to the detection circuit; and in each of the first piezoelectric plate and the second piezoelectric plate, a longitudinal vibration electrode provided for the longitudinal vibration polarization portion and a bending vibration electrode provided for the bending vibration polarization portion are not included in a same plane that is perpendicular to a vibration direction of the longitudinal vibrations, such that all of a plurality of vibration electrodes can be used as vibration electrodes, or such that some of the plurality of vibration electrodes can be used as detection electrodes and others of the plurality of vibration electrodes can be used as vibration electrodes.

12. A microscope stage having an ultrasonic motor for causing elliptical vibrations at a contacting point with a driven object by utilizing bending vibrations and longitudinal vibrations, said ultrasonic motor comprising:

a vibrator formed by stacking a plurality of rectangular piezoelectric plates in a thickness direction;

a driving circuit for applying a driving signal to a piezoelectric plate; and a detection circuit for detecting an electromotive force generated when a piezoelectric plate deforms, wherein:

the plurality of rectangular piezoelectric plates include a first piezoelectric plate and a second piezoelectric plate;

in each of the first piezoelectric plate and the second piezoelectric plate, a longitudinal vibration polarization portion that can excite the longitudinal vibrations and a bending vibration polarization portion that can excite the bending vibrations are polarized in a thickness direction;

the first piezoelectric plate is connected to the driving circuit and the detection circuit, and the second piezoelectric plate is connected to the driving circuit and is not connected to the detection circuit; and in each of the first piezoelectric plate and the second piezoelectric plate, a longitudinal vibration electrode provided for the longitudinal vibration polarization portion and a bending vibration electrode provided for the bending vibration polarization portion are not included in a same plane that is perpendicular to a vibration direction of the longitudinal vibrations, such that all of a plurality of vibration electrodes can be used a vibration electrodes, or such that some of the plurality of vibration electrodes can be used as detection electrodes and others of the plurality of vibration electrodes can be used as vibration electrodes.

* * * * *

UNITED STATES PATENT AND TRADEMARK OFFICE
CERTIFICATE OF CORRECTION

PATENT NO. : 7,635,940 B2 Page 1 of 1
APPLICATION NO. : 11/986409
DATED : December 22, 2009
INVENTOR(S) : Yoshihiro Ue It is certified that error appears in the above-identified patent and that said Letters Patent is hereby corrected as shown below:

Column 14, line 29, (Claim 12, line 33);

Change "a" to --as--.

Signed and Sealed this

Third Day of August, 2010

David J. Kappos
*Director of the United States Patent and Trademark Office*